(12) United States Patent
Srinivasan et al.

(10) Patent No.: US 10,256,854 B1
(45) Date of Patent: Apr. 9, 2019

(54) SYNTHESIZER—POWER AMPLIFIER INTERFACE IN A WIRELESS CIRCUIT

(71) Applicant: Silicon Laboratories Inc., Austin, TX (US)

(72) Inventors: Rangakrishnan Srinivasan, Austin, TX (US); Sriharsha Vasadi, Austin, TX (US); Zhongda Wang, Sunnyvale, CA (US); Mustafa H. Koroglu, Austin, TX (US); John M. Khoury, Austin, TX (US); Aslamali A. Rafi, Austin, TX (US); Michael S. Johnson, Austin, TX (US); Francesco Barale, Westborough, MA (US); Sherry Xiaohong Wu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/875,278

(22) Filed: Jan. 19, 2018

(51) Int. Cl.
| | |
|---|---|
| *H04B 1/04* | (2006.01) |
| *H03F 3/195* | (2006.01) |
| *H03F 3/213* | (2006.01) |
| *H03F 3/45* | (2006.01) |
| *H03K 3/017* | (2006.01) |
| *H03F 1/32* | (2006.01) |
| *H03K 3/0231* | (2006.01) |

(52) U.S. Cl.
CPC ......... *H04B 1/0475* (2013.01); *H03F 1/3205* (2013.01); *H03F 3/195* (2013.01); *H03F 3/213* (2013.01); *H03F 3/45179* (2013.01); *H03F 3/45636* (2013.01); *H03K 3/017* (2013.01); *H03F 1/3211* (2013.01); *H03F 2200/171* (2013.01); *H03F 2200/451* (2013.01); *H03K 3/0231* (2013.01)

(58) Field of Classification Search
CPC ..... H04B 1/0475; H03F 1/3205; H03F 3/195; H03F 3/213; H03F 3/45636; H03K 3/017
USPC ........................................ 455/114.2
See application file for complete search history.

(56) References Cited

U.S. PATENT DOCUMENTS 6,670,838 B1 * 12/2003 Cao ...................... H03K 5/1565
                                                        327/175
9,641,141 B1    5/2017 Zheng et al.

OTHER PUBLICATIONS

U.S. Appl. No. 15/875,274, filed Jan. 19, 2018, entitled "System and Method For Reducing Output Harmonics", by Sherry X. Wu, et al.
(Continued)

*Primary Examiner* — Sanh D Phu
(74) *Attorney, Agent, or Firm* — Trop, Pruner & Hu, P.C.

(57) ABSTRACT

In an embodiment, an apparatus includes: a transmit circuit to upconvert a baseband signal to a first differential radio frequency (RF) signal, the transmit circuit to convert the first differential RF signal to a first single-ended RF signal; a duty cycle correction circuit coupled to the transmit circuit to receive the first single-ended RF signal and compensate for a duty cycle variation in the first single-ended RF signal to output a duty cycle-corrected RF signal; a conversion circuit to convert the duty cycle-corrected RF signal to a second differential RF signal; and an interface circuit to transfer the second differential RF signal from a first ground domain to a second ground domain.

20 Claims, 8 Drawing Sheets

(56) References Cited

OTHER PUBLICATIONS

Silicon Laboratories, "Helping Sengled Develop a Better Lightbulb," Dec. 6, 2017, 2 pages.
Silicon Laboratories, "Adding Smart Wireless Connectivity to an LED Lightbulb," at least as early as Dec. 5, 2017, 6 pages.

\* cited by examiner

US 10,256,854 B1

SYNTHESIZER—POWER AMPLIFIER INTERFACE IN A WIRELESS CIRCUIT

CROSS-REFERENCED APPLICATIONS

An application entitled "System and Method for Reducing Output Harmonics," application Ser. No. 15/875,274, invented by Sherry X. Wu, Sriharsha Vasadi, Mustafa H. Koroglu, and Rangakrishnan Srinivasan, filed of even date herewith and assigned to the assignee hereof.

BACKGROUND

As technology advances, integrated circuits (ICs) are adapted into ever smaller packages and incorporated into many different kinds of devices. In many cases, so-called Internet of Things (IoT) devices may communicate using integrated wireless circuits. Given the small size of the circuitry involved, many potential sources of interference may be present during wireless communications. For example, when transmitting radio frequency (RF) signals via an associated power amplifier, high currents can cause ground bounce, which can impact duty cycle and thereby even-order harmonic emissions, spurs due to power supply rejection and so forth, and in certain cases adversely impact circuitry of the wireless transmitter itself due to stability issues. Current solutions include providing extensive off-chip filtering circuitry, which comes at an expense of real estate, power and cost consumptions, to meet performance requirements, including harmonic and spurious emissions. And such solutions do not address adverse impacts on power amplifier stability due to inherent feedback through different ground domains itself.

SUMMARY OF THE INVENTION

In one aspect, an apparatus includes: a transmit circuit to upconvert a baseband signal to a first differential radio frequency (RF) signal, the transmit circuit to convert the first differential RF signal to a first single-ended RF signal; a duty cycle correction circuit coupled to the transmit circuit to receive the first single-ended RF signal and compensate for a duty cycle variation in the first single-ended RF signal to output a duty cycle-corrected RF signal; a conversion circuit to convert the duty cycle-corrected RF signal to a second differential RF signal; and an interface circuit to transfer the second differential RF signal from a first ground domain to a second ground domain.

In an embodiment, the interface circuit is further to convert the second differential RF signal to a second single-ended RF signal. The interface circuit may include: a first path having at least one inverter to receive a positive portion of the second differential RF signal and output the second single-ended RF signal; a second path having at least one inverter to receive a negative portion of the second differential RF signal; and a latch circuit coupled between the first path and the second path, the latch circuit to equalize an output formed of one or more of the positive portion and the negative portion of the second differential RF signal. The latch circuit may output the second single-ended RF signal from the first path and disregard the negative portion of the second differential RF signal from the second path.

In an embodiment, a repeater circuit may output the second single-ended RF signal to a power amplifier, which may be a differential power amplifier. The apparatus may further include: a first voltage regulator to provide a first supply voltage to the transmit circuit; and a second voltage regulator to provide a second supply voltage to the power amplifier. The apparatus may further include a switch circuit to decouple the first voltage regulator from the transmit circuit during a first mode in which at least one of the transmit circuit and the power amplifier is not active. The first voltage regulator is to provide the first supply voltage to the transmit circuit, the duty cycle correction circuit and the conversion circuit, and the second voltage regulator is to provide the second supply voltage to at least a portion of the interface circuit and the power amplifier.

In an embodiment, the apparatus further comprises: a first ground domain including the transmit circuit, the duty cycle correction circuit and the conversion circuit; and a second ground domain including at least a portion of the interface circuit and the power amplifier, the first ground domain to be provided with a first independent ground voltage, the second ground domain to be provided with a second independent ground voltage.

In an embodiment, the duty cycle correction circuit comprises: a first path having a first set of inverters and a first output transistor having a gate terminal coupled to an output of a first inverter of the first path and an output terminal coupled to an output node, where a pulldown impedance of the first inverter of the first set of inverters is controlled by a first trim signal; and a second path having a second set of inverters and a second output transistor having a gate terminal coupled to an output of a first inverter of the second path and an output terminal coupled to the output node, where a pullup impedance of a first inverter of the second set of inverters is controlled by a second trim signal and the duty cycle correction circuit is to provide the duty cycle-corrected RF signal at the output node.

In an embodiment, the apparatus may further include a controller to receive at least one feedback voltage from a power amplifier and to generate the first trim signal and the second trim signal based at least in part thereon. The conversion circuit may include: an inverter coupled to receive a positive portion of the duty cycle-corrected RF signal at the output node; and a buffer to receive a negative portion of the duty cycle-corrected RF signal at the output node.

In an embodiment, the apparatus comprises an integrated circuit having a first semiconductor die including the transmit circuit, the duty cycle correction circuit, the conversion circuit, the interface circuit and a power amplifier. The apparatus may include a smart bulb including one or more light emitting diodes and a controller to control the one or more light emitting diodes, wherein the power amplifier is to send a communication to an automation system.

In another aspect, an integrated circuit comprises: a driving circuit to output a single-ended clock signal; a first conduit to communicate the single-ended clock signal; a duty cycle correction circuit coupled to the first conduit to receive the single-ended clock signal and compensate for a duty cycle variation in the single-ended clock signal caused by harmonic energy; a conversion circuit to convert the compensated single-ended clock signal to a differential signal; an interface circuit to transfer the differential signal from a first ground domain to a second ground domain and convert the differential signal to a second single-ended signal; and a second conduit to communicate the second single-ended signal to a receiving circuit.

In an embodiment, the duty cycle correction circuit is controllable in response to feedback information from the power amplifier, where the duty cycle variation is caused by a ground bounce in the second ground domain. The interface circuit may include: a first path having at least one inverter to receive a positive portion of the differential signal and output the second single-ended signal, the at least one inverter of the first path to receive a ground voltage of the second ground domain; a second path having at least one inverter to receive a negative portion of the differential signal, the at least one inverter of the second path to receive the ground voltage of the second ground domain; and a latch circuit coupled between the first path and the second path, the latch circuit to improve immunity to ground bounce and/or duty cycle variation in at least the positive portion of the differential signal, the variation due to the harmonic energy.

In another aspect, a method comprises: receiving, in a duty cycle correction circuit of a transmitter, a first single-ended RF signal; compensating, in the duty cycle correction circuit, for a duty cycle variation in the first single-ended RF signal; outputting a duty cycle-corrected RF signal from the duty cycle correction circuit to a conversion circuit, and converting the duty cycle-corrected RF signal to a differential RF signal; transferring the differential RF signal from a first ground domain of the transmitter to a second ground domain of the transmitter; and converting the differential RF signal to a second single-ended RF signal, and sending the second single-ended RF signal to a differential power amplifier.

In an embodiment, the method further comprises removing variation in the differential RF signal due to variation between the first ground domain and the second ground domain before converting the differential RF signal to the second single-ended RF signal, the first ground domain isolated from the second ground domain. Compensating for the duty cycle variation may include adjusting the first single-ended RF signal based at least in part on feedback information from the differential power amplifier.

DETAILED DESCRIPTION

In various embodiments, circuitry may be adapted between a local oscillator (LO) portion of a transmitter circuit and a power amplifier (PA) of the transmitter circuit to enable duty cycle correction of the outgoing signal from the LO section. In addition, this circuitry may be used to convert signaling information from single-ended to differential form to allow further signal processing to be performed differentially, and thereafter to re-convert the signaling information back to single-ended form for communication to the power amplifier itself. In this way, reduced power consumption is realized, while at the same time providing for better signal performance, reducing distortions caused by various harmonics resulting from so-called ground bounce. This ground bounce may be caused by the power amplifier. And as a result, external filtering circuitry otherwise needed to filter signal information can be reduced or avoided, reducing cost and size of a given solution, by reducing or avoiding need for off-chip components.

Figure 1A:
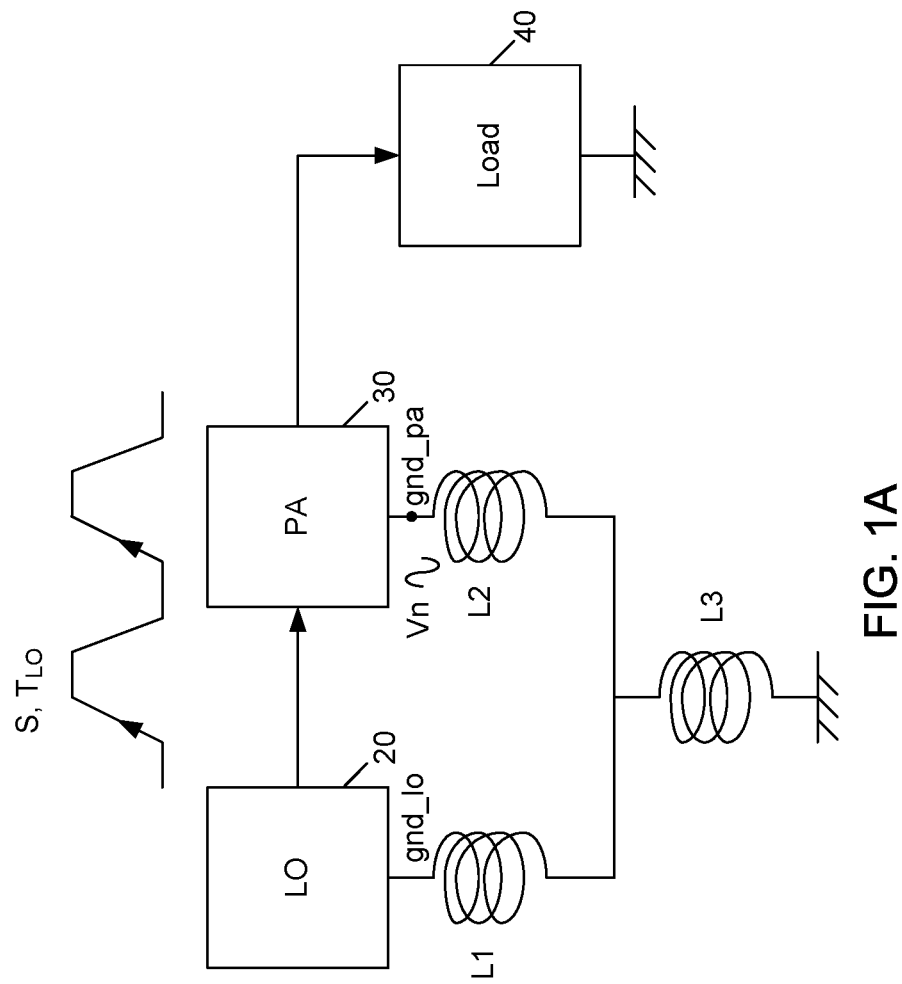
FIG. 1A is a high level block diagram of a system in accordance with an embodiment.

Referring now to FIG. 1A, shown is a high level block diagram of a system in accordance with an embodiment. As shown in FIG. 1A, system 10 may be a wireless communication device that may communicate according to any given communication protocol. Of interest in FIG. 1A, note that multiple ground domains are present, including a first ground domain in which an LO 20 is present and a second ground domain in which a power amplifier (PA) 30 is present. LO 20 may include circuitry to upconvert baseband signals into RF signals and provide them to PA 30, which in turn amplifies the signals and provides them to a load 40, e.g., implemented as an antenna. In the embodiment of FIG. 1A, the two different ground domains in which these circuits are present are represented by corresponding inductors L1 and L2, which in turn couple to a parasitic inductance L3 of a package paddle to an ideal circuit board ground.

In the cross-domain coupling between these two ground domains, various processing can be performed to improve PA stability with lower loop gain and tolerance for higher ground bounce. Furthermore, this processing may include transforming signals from single-ended to differential form and back to single-ended form for current efficiency and effective cross-domain loops. As such, signaling between LO 20 and PA 30 may occur with fast edges at the interface (namely the cross over between the two ground domains), despite a potentially long conduit that couples these different ground domains together. As seen, this signal stream may be communicated with a duty cycle at substantially 50% and relatively high slope (represented by S) which may aid in PA stability, duty cycle control and reduction of spurs due to better power supply rejection to ground bounce. As will be described further herein, duty cycle calibration/correction may provide benefits for even-order harmonic emissions and self-interference.

With an arrangement as in FIG. 1A, PA stability may be enhanced, as a loop gain may be proportional to a noise level (due to ground bounce, $V_n$, represented in FIG. 1A at node, gnd_pa) and the slope (S), as follows:

$$\frac{V_n}{S} \cdot \frac{2\pi f_{LO}}{2},$$

where $$f_{LO} = \frac{1}{T_{LO}}$$

and $f_{LO}$ is the frequency of the LO signal. In an embodiment, the interface between the two ground domains, gnd_lo and gnd_pa, and the subsequent circuitry may be a weak function of $V_n$ with both duty cycle control and with the aid of a latch circuit. Furthermore, the slope S at the ground domain crossing is high, at approximately 50 volts per nanosecond. The loop gain is thus minimized and thereby enhancing the loop or PA stability. Note that a high slope, S, or edge-rate, also minimizes the duty cycle variation, where a shift in the edge is given by $\Delta T=V_n/S$. For example, when the ground bounce $V_n$ has second harmonic content, depending on the phase relationship between LO and the ground bounce, the effective duty cycle variation on the LO, d, may be $$\frac{T_{LO}/2 \pm 2\Delta T}{T_{LO}}.$$

Figure 1B:
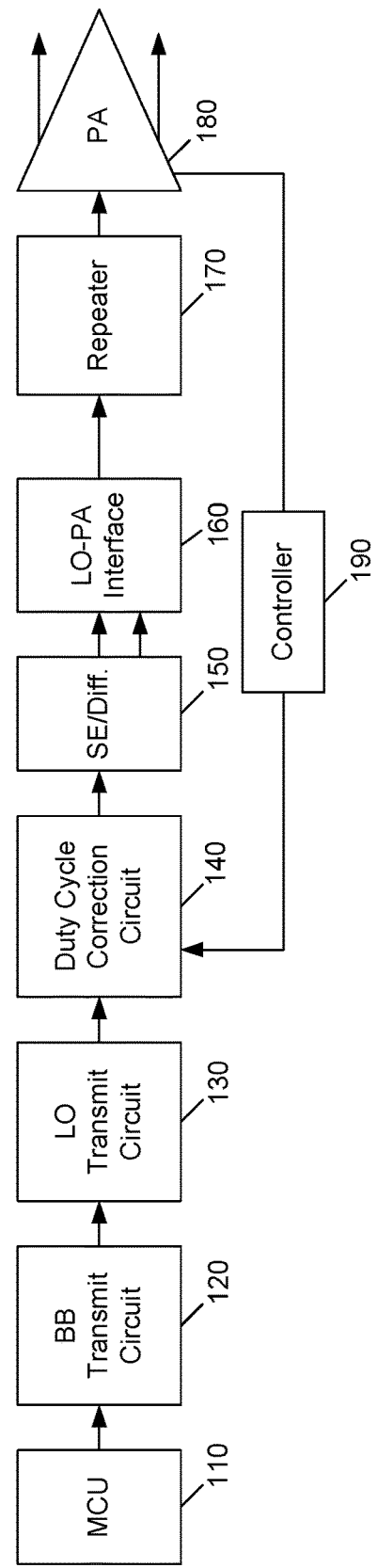
FIG. 1B is a block diagram of a portion of an integrated circuit in accordance with an embodiment.

Referring now to FIG. 1B, shown is a block diagram of a portion of an integrated circuit in accordance with an embodiment. More specifically, integrated circuit 100 may be adapted on a single semiconductor die and may include a microcontroller (MCU) 110. MCU 110 may perform various computations and control operations as dictated by a given set of instructions. Resulting information that is to be communicated from integrated circuit 100 is provided to a baseband transmit circuit 120. In embodiments, baseband transmit circuit 120 may perform preparatory signal processing on the incoming digital information and convert the digital information to analog form. In an embodiment, baseband transmit circuit 120 may operate differentially and output differential signals. However, in the embodiment of FIG. 1B, baseband transmit circuit 120 is configured to output digital baseband signals that are single-ended. In turn, the resulting processed baseband signals are provided to a local oscillator (LO) transmit circuit 130. For transmit schemes without a quadrature requirement, LO transmit circuit 130 processes a differential voltage controlled oscillator (VCO) frequency synthesizer output into a single-ended divide by 2 output with a nominal 50% duty cycle. Note that the effective control voltage of the VCO in the frequency synthesizer is single-ended but with VCO providing differential outputs. LO transmit circuit 130 may perform further signal processing, including upconversion to RF frequency. Note that these RF signals may be modulated according to a given modulation scheme such as a frequency or phase modulation scheme. The resulting modulated output is buffered appropriately via a single-ended conduit. As described herein, although these signals output from LO transmit circuit 130 are at RF levels, for discussion purposes, these output signals are interchangeably referred to herein as "LO signals" or "LO clock signals." Understand that such LO clock signals are modulated with information to be communicated. However, the modulation is in the way of frequency or phase modulation within the signal stream, rather than by amplitude modulation. As such, understand that as used herein the term "LO clock signal" refers to a modulated RF signal stream. Note that the techniques described herein regarding the interface circuitry may be generally applied in other situations. For example, embodiments may be used in systems that use quadrature modulation schemes with both amplitude and phase information. As described further herein, interfaces in accordance with embodiments help in PA stability and improve robustness to load pull variations by decreasing the gain due to parasitic elements in the feedback loop.

As will be described herein, LO transmit circuit 130 may operate within an independent ground domain with respect to a power amplifier of integrated circuit 100 (namely PA 180, discussed further below). As used herein, the term "ground domain" is used to refer to a collection of circuitry adapted on a semiconductor die that receives common sources of power and ground. In different cases, such circuit collections that form a domain can be adapted on closely located portions of the die. In some cases, one or more domains may be implemented within isolation circuitry, such as an isolation barrier that surrounds at least some of the domain's circuitry. Still further, ground domains herein may include or be associated with a given source of supply voltage and reference or ground voltage. With this isolation and provision of independent voltages, domains themselves can be power controlled separately. As such, different domains may receive different supply voltages and can be independently controlled to be powered on or off as appropriate for particular modes of operation.

Furthermore, by way of providing separate and isolated ground domains, interference within other domains such as the LO ground domain caused by ground bounce within the PA ground domain may be reduced. Nevertheless, some interference within the LO ground domain may occur, causing variations in the duty cycle of the LO signal output from LO transmit circuit 130, which is output in single-ended form. Depending upon the type of harmonic noise caused by the ground bounce, different duty cycle variations are possible. For second (or other even) harmonics when ground bounce has second harmonic energy at a frequency of twice of a local oscillator frequency ($2f_{LO}$), a first-order duty cycle variation in the way of a duty cycle shift may occur by way of narrowing or widening of pulses within the LO output. Instead for first (or other odd) harmonics having a second-order effect on duty cycle when ground bounce has energy at a fundamental frequency (e.g., ground bounce at a frequency of $f_{LO}$), the duty cycle variation may be in the form of a constant delay within, e.g., the high portions of the LO signals. Stated another way, when ground bounce has second harmonic energy at 2 $f_{LO}$, it affects the rising and falling edges of the LO clock signal in opposite directions. And in turn, when ground bounce has energy at a fundamental frequency (e.g., at $f_{LO}$) it affects the rising and falling edges in almost the same way, realizing the constant delay in the LO clock signal.

To reduce or remove these duty cycle variations, the LO signals output from LO transmit circuit 130 are provided to a duty cycle correction circuit 140 which, as will be described herein, may be used to correct for such duty cycle variation. Note that as further described herein, this duty cycle control may be based on feedback information. More specifically as further illustrated in FIG. 1B, a feedback path couples from PA 180 to a controller 190. In embodiments, controller 190 may be implemented as a hardware processing circuit, such as a microcontroller or so forth. Controller 190 may be coupled to a non-transitory storage medium that stores instructions to enable controller 190 to process this feedback information and generate control signals, described herein as so-called trim signals, that are provided to duty cycle correction circuit 140. In turn, duty cycle correction circuit 140 may use these control signals to accommodate for variations in duty cycle.

The duty cycle-corrected signals may in turn be provided to a conversion circuit 150, which may perform a single-ended-to-differential conversion. Thereafter, these differential signals are provided to an interface 160, which may include processing circuitry to create sharper edges within the resulting differential signals. Still further, interface 160 may perform a transfer of these incoming signals from one independent ground domain to another independent ground domain, namely from the LO ground domain to the PA ground domain. After such processing, the signal information again is converted to single-ended form within interface 160 before being communicated to PA 180, e.g., via an optional repeater circuit 170. While shown as separate components for ease of discussion, in general a synthesizer-PA interface may be implemented via all of circuits 140, 150, 160 and 170, in an example.

In embodiments herein, note that PA 180 may be implemented as a differential power amplifier and may be adapted on the same single semiconductor die as the other components of integrated circuit 100. However understand that in other implementations, a PA may be implemented off-chip. It is still possible for the techniques described herein to be used in such implementations, as even with an external PA, ground bounce effects may exist. Note that for a system having an external PA, an on-chip driver amplifier still may be present having an output power of e.g., 5 dBm or so. Some ICs also may have a 0 dBm power amplifier. In these lower output on-chip driver/power amplifiers, the techniques described herein also come in useful, as they help in lowering current consumption and potentially eliminating an external off-chip matching network itself. The issue of ground bounce affecting performance may be less severe as compared to a higher power (e.g., 20 dBm) power amplifier, but may still be present, as is also the case for single-ended power amplifiers, for implementations with external PAs.

Note that there may be relatively long conductive traces between interface 160 (and repeater 170, potentially) and PA 180. Similarly, relatively long conductive traces may be present between LO transmit circuit 130 and duty cycle correction circuit 140 or between duty cycle correction circuit 140 and conversion circuit 150. By communicating signals between these different circuits in single-ended form, reduced power consumption and complexity may inhere. Understand while shown at this high level in the embodiment of FIG. 1B, many variations and alternatives are possible. For example, understand that integrated circuit 100 may further include receiver circuitry to receive and process incoming RF signals.

Figure 2:
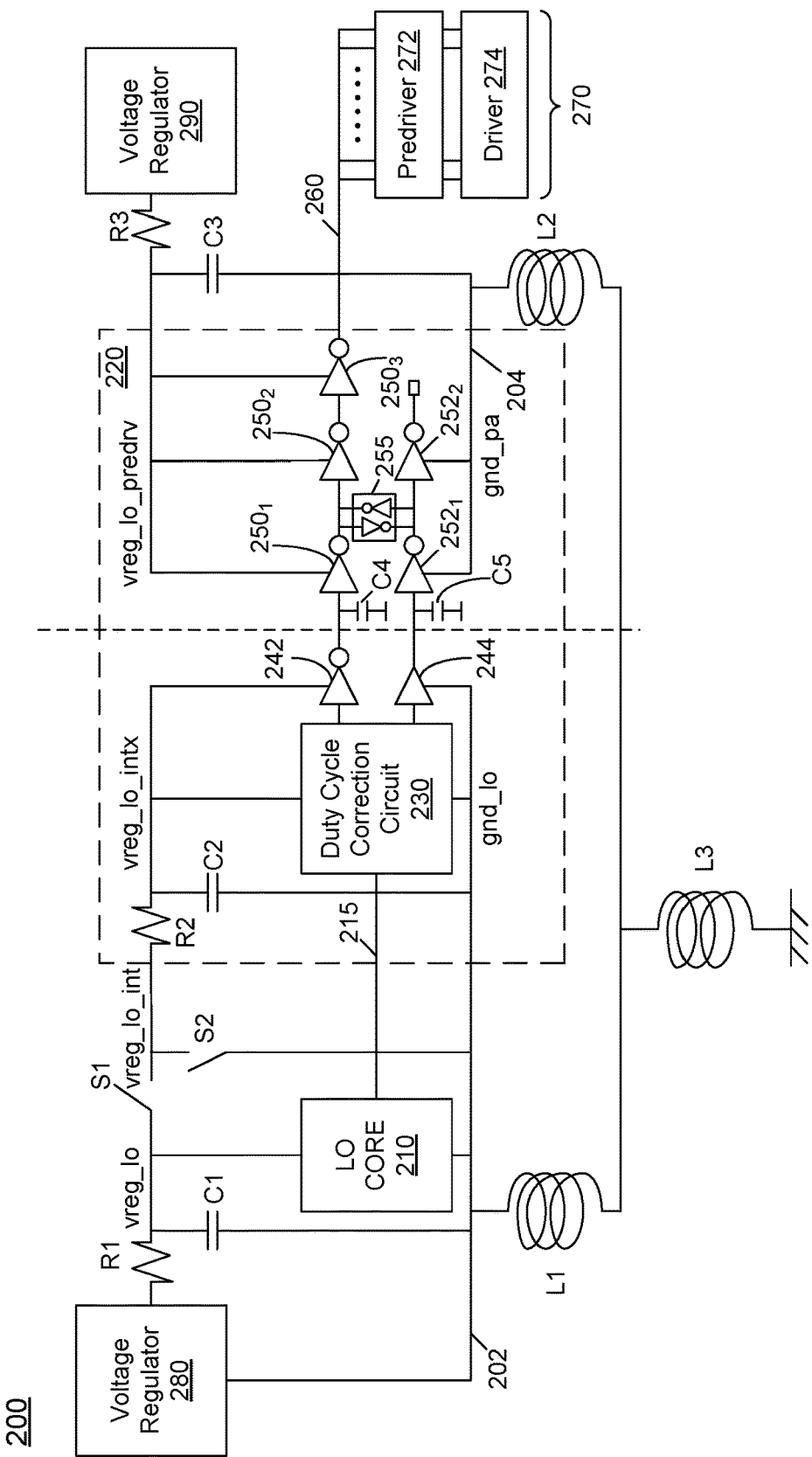
FIG. 2 is a block diagram of a synthesizer-power amplifier interface in accordance with an embodiment.

Referring now to FIG. 2, shown is a block diagram of a synthesizer-power amplifier interface in accordance with an embodiment. As illustrated in FIG. 2, circuit 200 may be part of a wireless chip, such as integrated circuit 100 of FIG. 1B. As seen, a synthesizer/local oscillator circuit 210 is present (also referred to as a "LO core"). Note the terms "synthesizer" and "LO" are used interchangeably to refer to transmitter circuitry that upconverts baseband signals to RF level and performs further processing, such as gain control, pre-emphasis and other filtering to compensate for the synthesizer frequency response, wide-band synthesizer and quantization noise cancellation or so forth. In turn, the resulting LO signals are provided to an interface circuit 220. In embodiments herein, interface circuit 220 acts as an interface between a LO ground domain 202 and a PA ground domain 204. Note that LO ground domain 202 is an independent collection of circuitry that is provided with a common source of power and ground, which may be isolated from other domains, including PA ground domain 204, which is another independent collection of circuitry provided with common sources of power and ground.

As illustrated, interface circuit 220 itself may include different portions each present in these two different ground domains. As such, interface circuit 220 is the location at which signals are passed from one ground domain to another. Note that a conduit 215 that couples LO core 210 to interface circuit 220 may be a relatively long (e.g., on the order of thousands of microns, as is preferable to keep the PA naturally further away from the VCO in the synthesizer) conductive trace adapted on one or more layers of a semiconductor die. As such, power consumption savings may be realized by communicating this signal in single-ended form. Note that this capability of communicating LO signals along conduit 215 in single-ended form may be realized in particular modulation schemes, such as direct-up modulation of Gaussian minimum shift keying (GMSK) or offset quadrature phase shift keying (O-QPSK) signaling that have no quadrature requirements. Of course embodiments that enable single-ended communication along long interconnects may be realized for other modulation schemes. Examples include other constant envelope modulation schemes like Gaussian frequency shift keying (GFSK)/2GFSK/4GFSK, etc., and also schemes that provide a constant LO without quadrature requirements like on-off keying (OOK)/amplitude shift keying (ASK).

Still referring to FIG. 2, interface circuit 220 includes a duty cycle correction circuit 230 which, as previously described above, may be used to reduce duty cycle variation in the incoming LO signals. Thereafter, these duty cycle-compensated signals may pass from LO ground domain 202 to PA ground domain 204 via an inverter 242 and buffer 244. Note at this high level, inverter/buffer 242, 244 may generally provide for conversion from single-ended to differential signaling (in the high level of illustration FIG. 2). As described further below, in a particular implementation, buffer circuitry may be used in performing this single-ended-to-differential conversion).

Still with reference to FIG. 2, a portion of interface circuit 220 included in PA ground domain 204 may include corresponding series of inverters $250_{1-3}$, $252_{1-2}$ and a latch circuit 255, to sharpen edges of the LO signals. C4 and C5 are parasitic capacitors that are minimized. As the inverters are sized low to keep effective cross-domain currents in the loops, mismatch considerations that require larger device sizes are effectively calibrated out with duty cycle correction circuit 230. Still further, by way of this arrangement another conversion occurs from differential to single-ended form. Thereafter, the resulting single-ended output from inverter $250_3$ is sent via a conduit 260 to a PA 270, itself formed of a pre-driver circuit 272 and a driver circuit 274. In embodiments herein, pre-driver circuit 272 may again convert the incoming signals to differential form, in embodiments in which PA 270 is a differential PA. Note that depending upon a power requirement, multiple slices within stages of pre-driver circuit 272 and driver circuit 274 may be enabled for output power control. In the case of a single-ended PA, the final single-differential conversion in the pre-driver need not happen. Further, if there are two single-ended PAs, the output of the differential pre-driver can be sent to both PAs.

Still with reference to FIG. 2, note that different power supplies may be provided for the different ground domains. Specifically, a first voltage regulator 280 may provide a supply voltage and ground signal to LO ground domain 202. Similarly, a second voltage regulator 290 may provide a supply voltage and ground signal to PA ground domain 204. Note that each of these regulators may have an associated filter, e.g., implemented as RC networks (namely a first RC network formed of resistor R1 and capacitor C1 associated with first voltage regulator 280), and a second RC network formed of resistor R3 and capacitor C3 associated with second voltage regulator 290). Note that first voltage regulator 280 may further be associated with an additional RC network formed of resistor R2 and capacitor C2. By way of these on-chip local supply filters, high frequency content may be contained from leaking out of the corresponding domains.

Interface circuit 220 may only be powered when it is active for a particular mode and band of operation. For example when PA 270 is not in operation, by way of switches S1 and S2, interface circuit 220 may be powered off. Note that voltage regulator 290 may be coupled to a power switch to be enabled only when in transmit mode. Note that by way of these switches to isolate voltage regulator 280 when corresponding PA 270 is not in operation, interaction between LO ground domain 202 and PA domain 204 may be eliminated. And the interface circuitry is powered up only when needed as LO core 210 is common to receive and transmit. Note further that in many cases, circuitry as in FIG. 2 may be implemented on a single semiconductor die with similar circuitry used for other bands of operation in a multi-band receiver/transmitter. In such cases, similar switch circuitry may be provided for all receive/transmit paths, such that when a given mode and/or band is to be active, its switches may be controlled to couple such circuitry to appropriate power supplies. And similarly, when such circuitry is not to be used for a particular mode and/or band, the switch circuitry may be controlled to decouple the circuitry from the corresponding power supply. As an example, there can be 0 dBm/20 dBm PAs for dual-band solutions (e.g., 2.4 GHz and sub-GHz). In receive mode, switches S1/S2 ensure the conduits to the transmit sections are quiet and do not pick up unnecessary interference and affect receive operations. In embodiments, a regulated voltage and ground are communicated via conduit 215 to power up duty cycle correction circuit 230, and inverter/buffer 242, 244. Note also there may be multiple such conduits (e.g., four for dual-band, 0 dBm/20 dBm).

As further shown, LO ground domain 202 may be represented by an inductance L1 and similarly PA ground domain 204 may be represented by an inductance L2. Also shown is another inductance L3, which represents a parasitic inductance of the paddle in the package and also the parasitic inductance from the paddle to the ideal circuit board ground, which is the reference ground. Note that inductances L1 and L2 are the respective trace and bondwire inductances from the local on-chip ground to the ground connection of the package. Due to the high amount of fundamental and harmonic currents output by PA 270, which traverses through a ground bond wire, a high ground voltage bounce may occur. By providing separate domains for the synthesizer and PA portions of circuit 200, the effects of this ground bounce within the synthesizer may be reduced. Note that while shown at this high level arrangement in the embodiment of FIG. 2, many variations and alternatives are possible. Furthermore, while for ease of discussion, interface circuit 220 is shown and described as including duty cycle correction circuit 230 and the additional circuitry discussed above, in other cases, a specific arrangement is more accurately shown as in FIGS. 1B and 3 where the duty cycle correction circuit (and a single-ended-to-differential converter) is separate from the interface circuitry via which a cross-domain coupling occurs.

Figure 3:
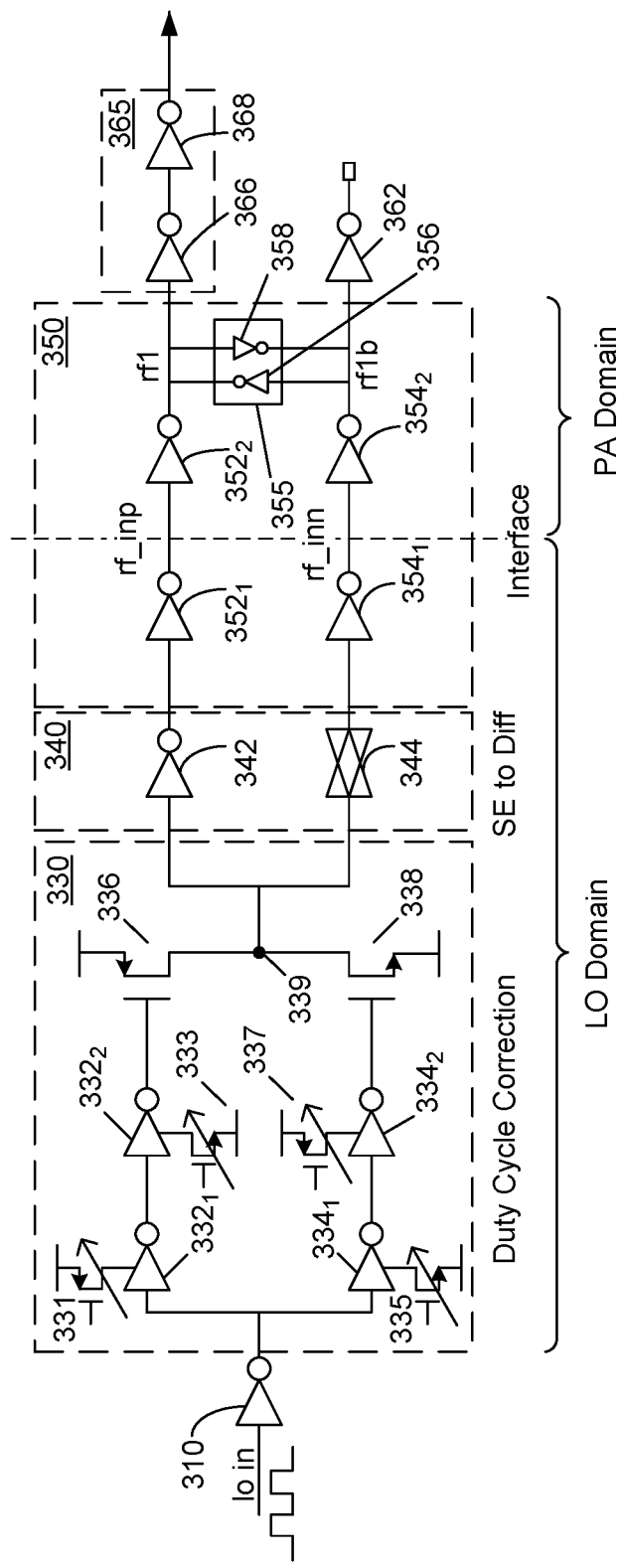
FIG. 3 is a block diagram of further details of an interface circuit in accordance with an embodiment.

Referring now to FIG. 3, shown is a block diagram of further details of an interface circuit between an LO domain and a PA domain in accordance with an embodiment. As shown in FIG. 3, interface circuit 300 includes a duty cycle correction circuit 330. As illustrated, duty cycle correction circuit 330 receives an incoming LO signal via an inverter 310. This signal is provided to parallel paths of inverters, namely a first path including inverters $332_1$, $332_2$ and a second path including inverters $334_1$, $334_2$. Note that these multiple paths in duty cycle correction circuit 330 process a single-ended signal output from inverter 310. That is, these parallel paths are used to process the same signal to compensate for duty cycle variations as described herein. As seen, each of these inverters may be controlled by respective pullup or pulldown impedances. Namely, a pullup impedance 331 is coupled to inverter $332_1$ and a pulldown impedance 333 is coupled to inverter $332_2$. In turn a pulldown impedance 335 is coupled to inverter $334_1$ and a pullup impedance 337 is coupled to inverter $334_2$.

As further illustrated, the outputs of inverters $332_2$ and $334_2$ are provided to corresponding output transistors, namely a pullup transistor 336 having a gate terminal coupled to the output of inverter $332_2$ and a pulldown transistor 338 having a gate terminal coupled to the output of inverter $334_2$. As seen, pullup transistor 336 is implemented as a P-channel metal oxide semiconductor field effect transistor (pMOSFET) having a source terminal coupled to a supply voltage node and a drain terminal coupled to an output node 339. Similarly, pulldown transistor 338 is implemented as an N-channel metal oxide semiconductor field effect transistor (nMOSFET) having a source terminal coupled to a ground voltage node and a drain terminal coupled to output node 339.

With duty cycle correction circuit 330, a duty cycle of the incoming signal may be corrected. Note that the controllable impedance provided to the inverters may be based on trim signals. In turn, these trim signals may be generated in a feedback circuit based on DC bias voltages sensed within the power amplifier. More specifically, DC bias voltages within the PA may be sampled by an analog-to-digital converter (ADC). There exists a one-to-one correspondence between the sensed DC bias and the actual duty cycle of the LO. The resulting digitized information in turn may be provided to a controller that compares such DC bias voltages to one or more thresholds. This controller may include or be coupled to a non-transitory storage medium that stores instructions that when executed enable the controller to perform the duty cycle correction described herein. If it is determined that the voltage exceeds a given threshold level, adjustment may be made to the trim signals provided to inverters of the first path or the second path. And vice versa, if the measured bias voltage is less than this threshold value, trim signals provided to the other of the first or second path may be adjusted. There may be separate trim signals for pullup and pulldown impedances. The pullup strength of inverter $332_1$ and pulldown strength of inverter $332_2$ determine turn on/turn off of PMOS device 336, which controls the rising edge of the LO waveform at output node 339. Likewise, the pulldown strength of inverter $334_1$ and pullup strength of inverter $334_2$ determine the turn on/turn off of NMOS device 338, which controls the falling edge of the LO waveform at output node 339. Note that in some cases, the measured voltage may be compared to multiple thresholds, such that adjustment to the trim signals may occur only if the measured voltage is more than a threshold range away from a given target threshold. Note that in other cases the duty cycle correction can be performed in other locations such as entirely in the PA domain itself or within the synthesizer as part of the LO core.

Duty cycle correction circuit 330 may improve even-order harmonics by correcting for duty cycle variations. By calibrating the duty cycle in this way, less harmonic content is included in the duty cycle-corrected signals output by duty cycle correction circuit 330. In this way, harmonic rejection may meet specified requirements. Furthermore, any remaining harmonic content in the resulting signals transmitted by the PA may be removed by way of smaller or simpler external harmonic filters, which may improve output power and efficiency due to lower insertion loss. For example, a three element off-chip filter may be used to filter remaining harmonic content, rather than a higher order off-chip harmonic filter, such as a five element off-chip filter.

Still with reference to FIG. 3, the resulting duty cycle-corrected signal output at output node 339 is provided to a conversion circuit 340 that performs a single-ended-to-differential conversion. Note in an embodiment, the PA output is measured for 50% duty cycle, and when it is at 50%, output node 339 may not be at a 50% duty cycle, but instead is "pre-distorted" so the overall result is correct. As seen, conversion circuit 340 includes an inverter 342 for the positive portion of the differential signal and a transmission gate 344 for the negative portion of the differential signal, such that the output of conversion circuit 340 is a differential signal provided to an interface circuit 350. Note that interface circuit 350 includes the actual domain crossing between the LO ground domain and the PA ground domain. By provision of interface circuit 350, very low cross-domain capacitance may be realized. In an embodiment, the components, namely inverters and transmission gates (or other buffers), within interface circuit 350 may be implemented with very low capacitance. For example, these inverters may have a capacitance of less than approximately 10 femtoFarads (fF) or other low sizing to maximize edge rate of the signals crossing from LO domain to PA domain and to keep effective cross-domain currents in the loops small, so that mismatch considerations that require higher sizing are effectively calibrated out with duty cycle correction. This domain crossing from the synthesizer domain into the PA domain occurs differentially. This differential communication may thus act to nullify cross-domain currents, reducing effective cross-domain capacitance and minimize the sensitivity of the signals to common-mode ground bounce. As a result, current circulation may be minimized through cross-domain off-chip loops through the bond wires of the respective grounds. Embodiments may thus realize less coupling between components of the different domains, such as a PA and synthesizer (with an embedded voltage controlled oscillator (VCO)), as well as an oscillator such as a crystal oscillator that provides an input clock signal to the synthesizer. Reduced sensitivity to ground bounce reduces the possibility of oscillations due to ground domain crossing.

As illustrated, each of the differential paths in interface circuit 350 includes multiple series-coupled inverters. Specifically the positive path includes a first inverter $352_1$ and a second inverter $352_2$. In turn the negative path includes a first inverter $354_1$ and a second inverter $354_2$. To provide for better-shaped signals, a latch circuit 355 couples between the differential paths. Note that latch circuit 355 itself may be implemented with multiple inverters that cross couple between the positive and negative paths. Specifically as shown, a first inverter 356 has an input coupled to the output of inverter $354_2$ and an output coupled to the output of inverter $352_2$. In turn, a second inverter 358 has an input coupled to the output of inverter $352_2$ and an output coupled to the output of inverter $354_2$. Note that inverters 356, 358 may be of lesser strength than the inverters of the primary paths.

By way of the conditioning performed in interface circuit 350, embodiments may enable less sensitivity to ground bounce for both spurs and for duty cycle modification. That is, by way of the signal conditioning performed in interface circuit 350, signal transitions from low to high and vice-versa may occur rapidly, e.g., on the order of approximately 20 picoseconds (ps) for rise and fall times. As a result of these fast transitions, common mode rejection ratio (CMRR) of ground-to-antenna may increase. Furthermore, by way of latch circuit 355, greater tolerance for higher ground swings (e.g., on the order of approximately 600 millivolts (mV)) peak may be realized. Latch circuit 355 may help to avoid the condition, where the ground voltage swing in the PA domain that is directly coupled to the receiving inverters $352_2$ and $354_2$ directly affects the fidelity of the LO signals in the positive and negative paths, avoiding the edges of the signal output by inverter $352_2$ of the primary (positive) path becoming too slow (such that the input edges may not be sufficiently tracked). Instead by way of latch circuit 355, very good edge rates may be realized (e.g., with sharp edges having rise/fall times less than 20 ps). Latch circuit 355 also helps minimize sensitivity to the phase difference between LO and ground bounce; and maintains sharp edges substantially independent of ground bounce due to the secondary path providing gain when the primary path becomes weak. This is the case, as latch circuit 355 enables the secondary path signal output by inverter $354_2$ to couple to the primary path signal output by inverter $352_2$ via inverters 356, 358 within latch circuit 355. As such, latch circuit 355 enables the output of interface circuit 350 to have a sufficient edge rate and less sensitivity to PA ground bounce that is beneficial for PA stability, duty cycle modifications and spurs by equalizing the positive and negative paths.

After this differential signal processing, the resulting signal is again transformed to single-ended form. Specifically, the negative path couples via another inverter 362 to a dummy load and is thus disregarded. In turn, the single-ended positive path is output to a repeater circuit 365, which may be formed of multiple series-coupled inverters, including inverters 366, 368. Note that by inclusion of repeater circuit 365, a length of a conduit to a PA may be reduced, providing sharper edges and better power supply rejection (PSR). Thereafter, the single-ended RF signal may be sent via a relatively long conduit to the PA, more specifically to a pre-driver circuit of the PA. Understand while shown at this high level in the embodiment of FIG. 3, many variations and alternatives are possible. For example, while the above-described implementation of FIG. 3 contemplates an arrangement in which a single-ended signal is input into duty cycle correction circuit 330, processed and then converted to differential form for further processing in interface circuit 350, thereafter transformed back to single-ended form for communication via a conduit to a differential amplifier where it is again transformed to a differential signal (and thus an arrangement of S (for single ended)-D (for differential)-S-D), other arrangements are possible. For example, a similar arrangement may be used to communicate a single-ended signal to an initial amplifier stage such as a pre-driver that in turn drives multiple single-ended PAs. Still further, embodiments may be used in implementations that perform S-D-S signaling, such that the resulting processed single-ended signal is sent to a single-ended PA.

Note that the conversion at interface circuit 350 back to single-ended form may, in addition to power reductions, also eliminate asymmetry in the differential paths. That is, there may be an asymmetry in the signal information of these two paths, such as by way of a delay in one of the paths due at least in part to ground bounce. In embodiments, it is possible for ground bounce to create a delay between the positive and negative paths, in turn causing this asymmetry which may affect even-order harmonics. With this re-conversion back to single-ended form, this asymmetry is resolved.

Figure 4A:
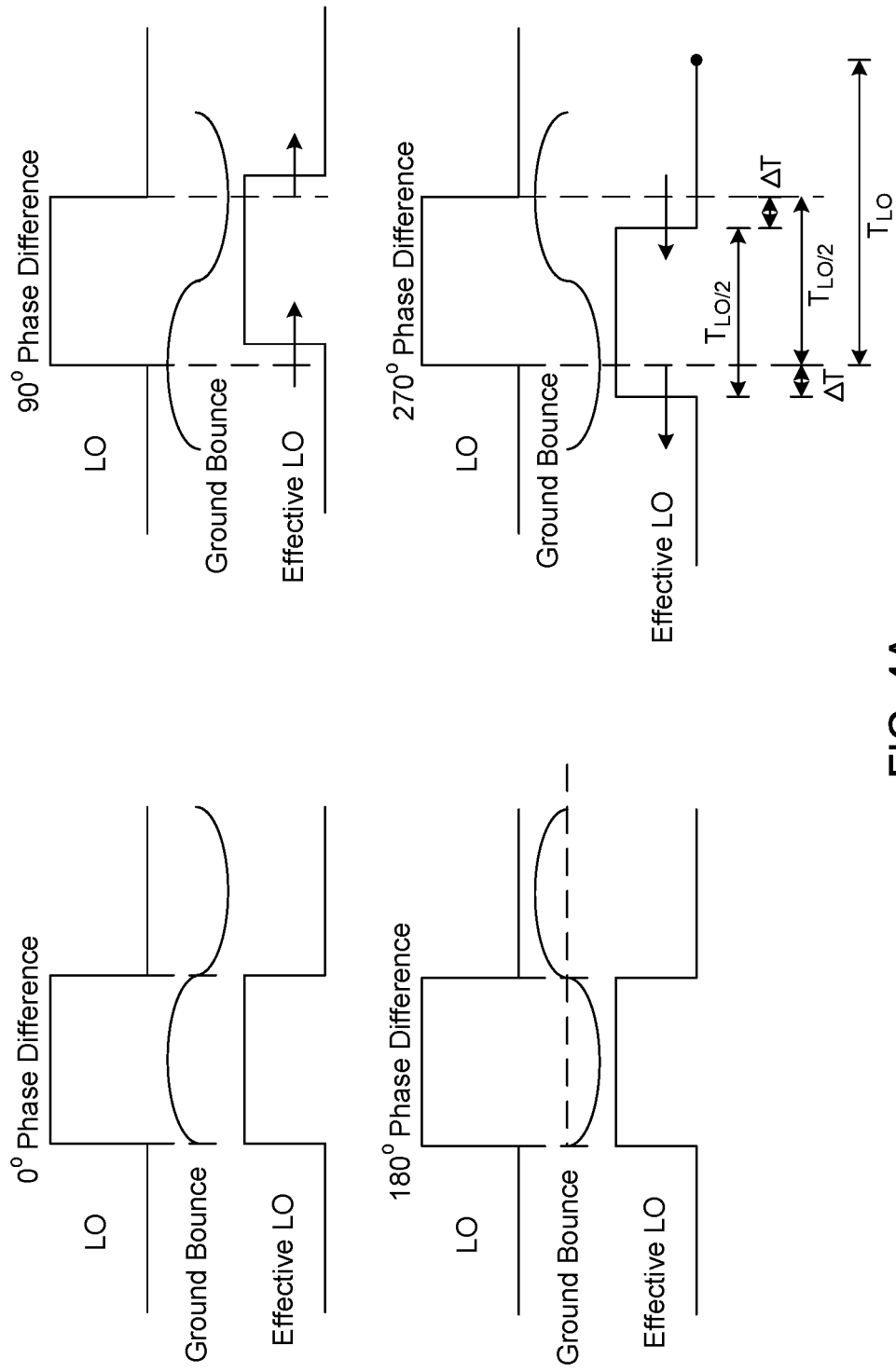
FIG. 4A is a graphical illustration of duty cycle variations caused by ground bounce in accordance with an embodiment.

Referring now to FIG. 4A, shown is a graphical illustration of duty cycle variations caused by ground bounce, with the ground bounce at $f_{LO}$. As illustrated in FIG. 4A, at varying phase differences between the ground bounce and the LO signal that is not well controlled and may be anywhere between 0-360°, as is dependent on process, temperature and package, different impacts are possible. Specifically, FIG. 4A shows the impact of LO-ground bounce phase differences at 0°, 90°, 180°, and 270°. As seen, at phase differences of 90° and 270°, a constant delay in the incoming LO signal may occur due to ground bounce on the ground voltage of a receiving inverter (e.g., inverters $352_2$ and $354_2$ of FIG. 3). As such, duty cycle variation as illustrated shows that this ground bounce affects rising and falling edges similarly. As such, these examples illustrate a constant delay and no duty cycle modification. This is the case, as latch circuit 355 provides an effective driver strength that is similar in all four of these cases, even with a high ground bounce (due to the secondary path providing gain).

Figure 4B:
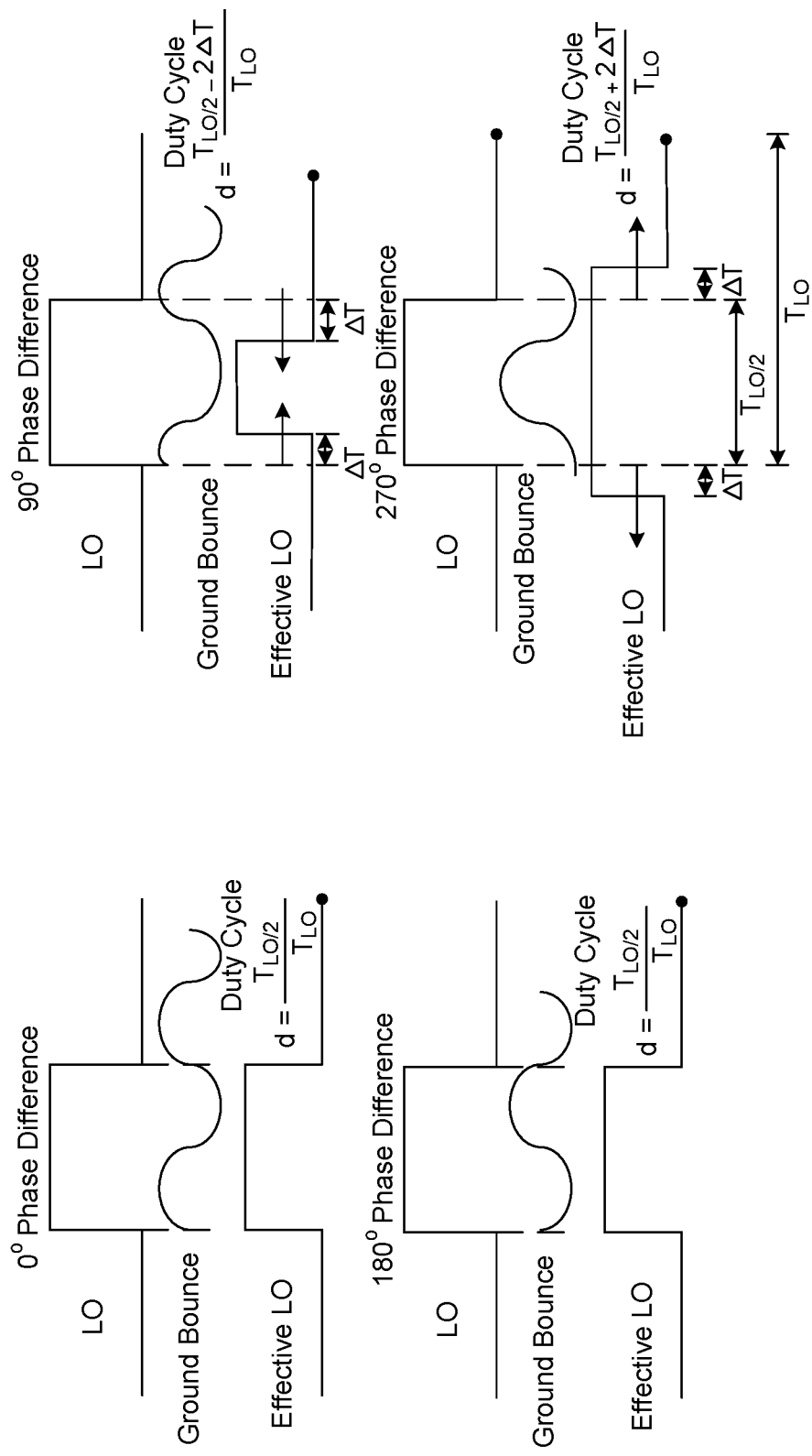
FIG. 4B is a graphical illustration of duty cycle variations caused by ground bounce in accordance with an embodiment.

Referring now to FIG. 4B, shown are illustrations of impact of LO-ground bounce phase differences where the ground bounce is at a frequency of 2 $f_{LO}$. As shown in the examples at 90° and 270° phase differences, duty cycle variation may further cause a shift in the LO signal in which rising and falling edges of the signal are affected in opposite directions, causing duty cycle variation. More specifically as shown in the 90° phase difference case, the pulse width is narrowed, lowering the duty cycle. Instead at 270°, the phase difference widens the pulse, increasing the duty cycle. These two scenarios have a similar effect on harmonic emissions. Note that there is no impact at 0 or 180° phase difference. Note also that phase differences may not be well controlled and can vary with process, temperature and package/board considerations, and can more generally be any phase difference from 0 to 360°. By providing interface circuit 350 with latch circuit 355, sufficient drive strength may be present to enable sharp edges when bounce is higher due to the secondary path and equalization.

Thus understand it is possible for duty cycle variations to increase or decrease the duty cycle depending on the phase relationship of the ground bounce and the actual LO signal. This relationship may be dependent on process corner, temperature, the package and circuit board itself. Any deviation from 50% either way, as in 48% or 52%, has the same impact on the second (and even-higher order) harmonic and emissions. With a CMOS PA, the P and N sides compensate to keep output power constant, but the duty cycle mismatch of the two sections affects the second harmonic content in the same way. More generally, the second harmonic content vs. deviation from ideal 50% is symmetric, independent of PA realizations. In other words, 45% duty cycle is similar to 55% duty cycle, and a 5% deviation from ideal. Such duty cycle variations may be as a result of ground bounce energy at a frequency of twice $f_{LO}$. Note that without using an embodiment, duty cycle variations causing a 2% shift in the effective duty cycle of the incoming signal from ideal 50% may be sufficient to degrade second harmonic emissions by an undesired amount.

Figure 5:
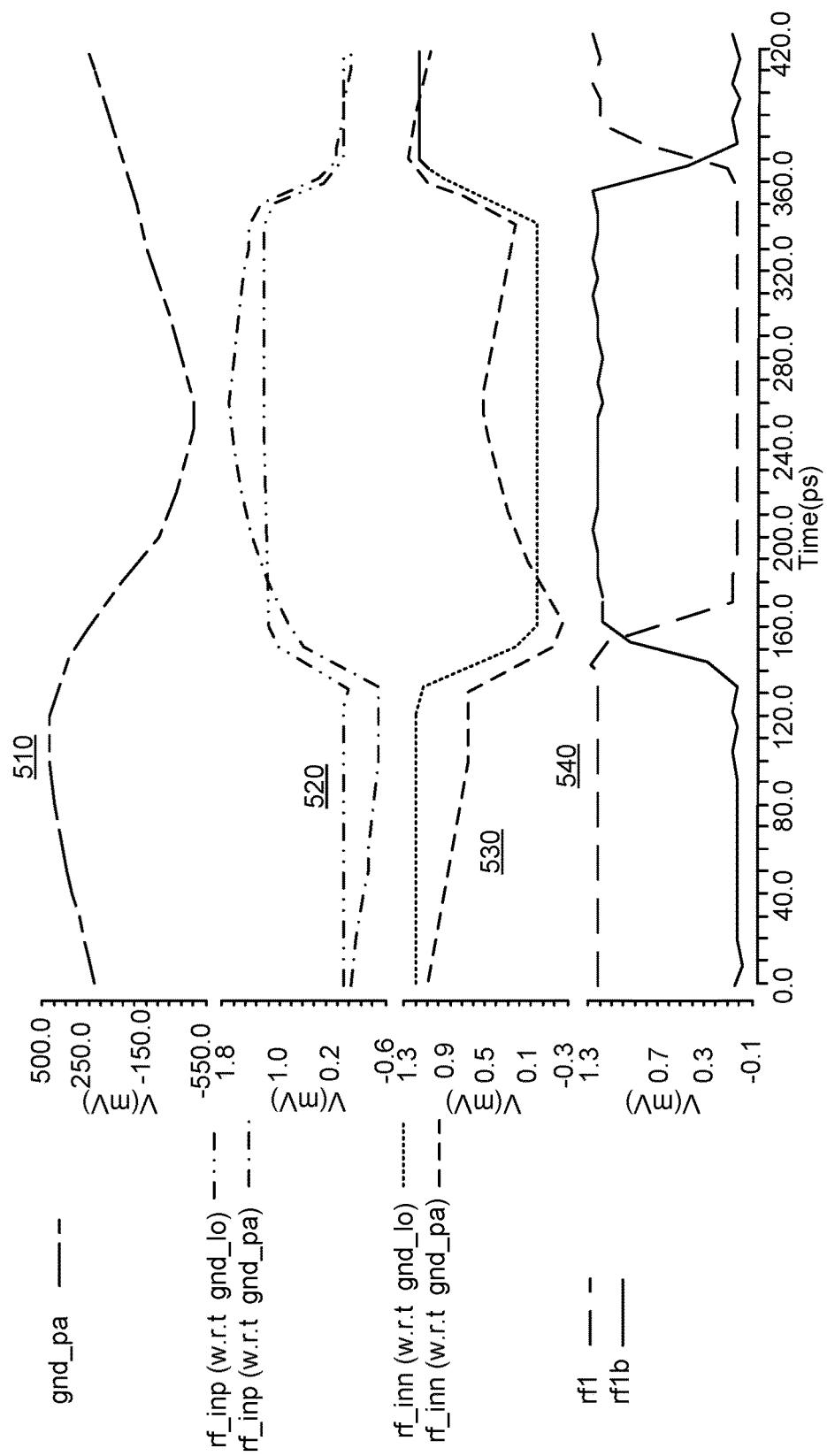
FIG. 5 are waveforms illustrating ground bounce and its effect on RF signals in accordance with an embodiment.

Referring now to FIG. 5, shown are waveforms illustrating ground bounce of a ground voltage of the PA, and its effect on RF signals around the domain crossing between the LO ground domain and the PA domain. Here a certain phase relationship between the ground voltage of the PA and the incoming LO signal is shown, which can more generally be any value from 0 to 360 degrees, depending on the process, temperature and package. By providing a latch circuit (as with latch circuit 355 of FIG. 3), phase relationship differences between the LO signal and ground bounce become a non-issue, even where such phase differences may not be well controlled due to variations in process, temperature and package/environment.

As illustrated at curve 510, a relatively high amount of PA ground bounce may exist (e.g., on the order of 600 mV peak). For a high ground bounce at the fundamental frequency $f_{LO}$, as illustrated in curves 520, the signal strength of the positive portion of the RF input signal (rf_inp, as shown on FIG. 3 output from inverter $352_1$ to the domain crossing and for further processing by inverter $352_2$) with respect to this PA ground level becomes weaker when the actual ground voltage swings above zero voltage, and thus is less well controlled (as compared to the level of this RF input signal with respect to the LO ground). In turn the ground voltage is coupled to the supply voltage through the decoupling capacitor C3 of FIG. 2 as well. For voltage excursions around zero on the ground node, it swings above vreg_lo_predrv by a similar amount. As illustrated in curves 530 the signal strength of the negative portion of the RF input signal (rf_inn, as shown on FIG. 3 output from inverter $354_1$ to the domain crossing for further processing by inverter $354_2$) with respect to this PA ground level becomes stronger and thus less well controlled (as compared to the level of this RF input signal with respect to the LO ground). The above signatures can be reversed depending on the phase relationship between the ground voltage of the PA and incoming LO signals. However, latch circuit 355 helps maintain good fidelity of the LO signal independent of the phase difference with a high level of ground bounce. Still further as shown in FIG. 5, even-order harmonic effects may occur due to the asymmetry between the toggling of the positive and negative paths. Specifically as illustrated, at curves 540 the negative path portion rflb toggles before the corresponding positive path portion rfl (still with reference to FIG. 3 for signal locations). As a result by only outputting a single-ended one of these RF signals (namely the positive portion), the effects of this asymmetry can be removed.

Figure 6:
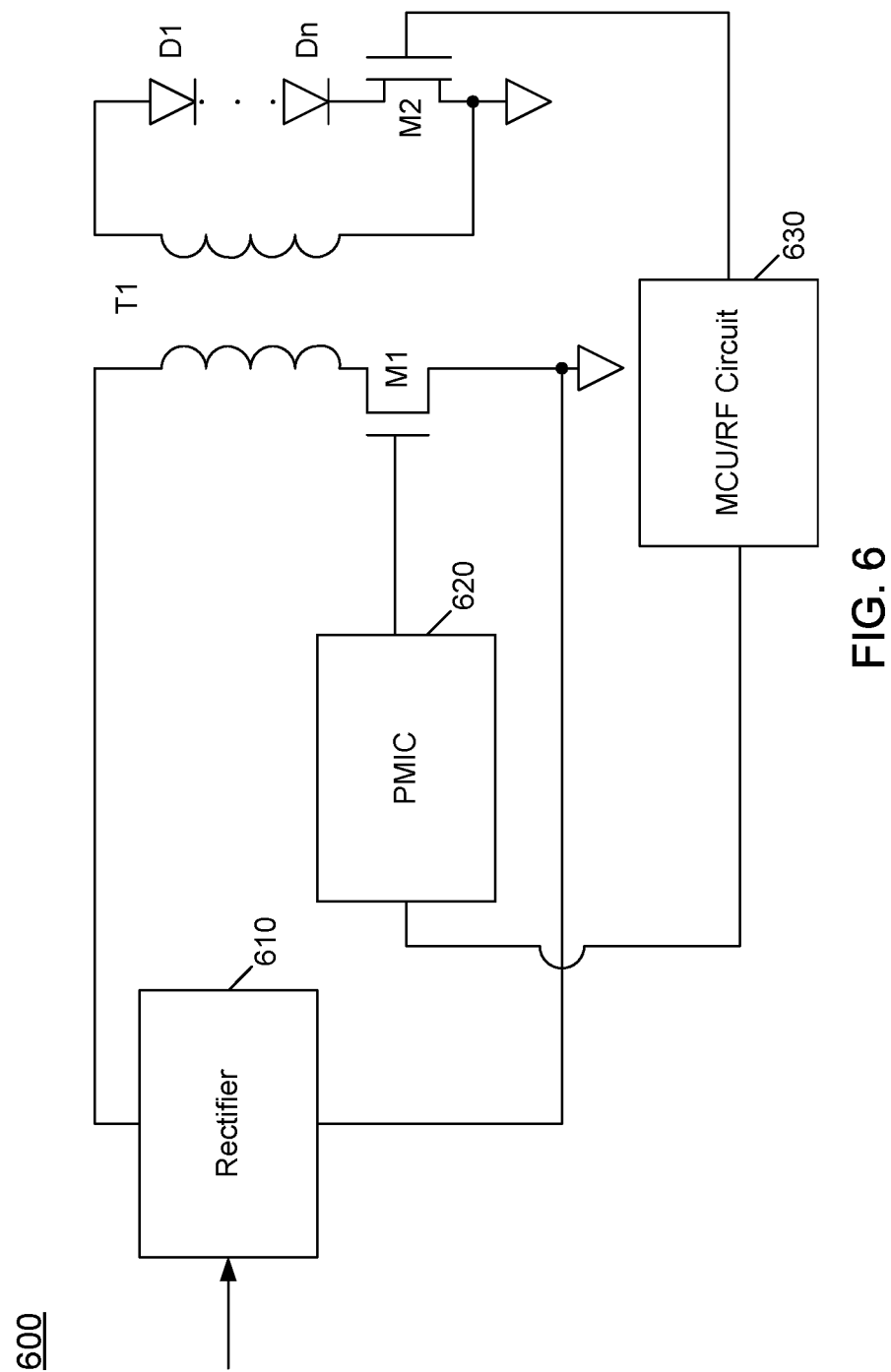
FIG. 6 is a block diagram of a smart light bulb in accordance with an embodiment.

Embodiments that provide for a flexible synthesizer-power amplifier interface may be used in a wide variety of systems. As one representative example, an integrated circuit including a synthesizer-power amplifier interface as described herein may be implemented in a so-called smart light bulb. Referring now to FIG. 6, shown is a block diagram of a smart light bulb in accordance with an embodiment. More specifically, light bulb 600 may be a LED-based light bulb having one or more series-coupled LEDs D1-Dn. To provide control of light bulb 600 in different modes, a power management integrated circuit (PMIC) 620 and a MCU/RF circuit 630 may be provided. In general, PMIC 620 may include electrical ballast for light bulb 600 and may control provision of power, received via a rectifier 610, to LEDs D1-Dn, via a transformer T1. To this end, PMIC 620 may control a first MOSFET M1 to provide power to LEDs D1-Dn.

Still further, MCU/RF circuit 630 may receive wireless commands for control modes for light bulb 600. For example, MCU/RF circuit 630 may receive wireless control signals, e.g., from a given user device, such as a home automation control system, a smartphone application that executes on a user's smartphone or so forth. Further, understand that via MCU/RF circuit 630, health and other status information regarding light bulb 600 may be communicated to various destinations, such as the home automation control system. Furthermore, based upon control signals, e.g., received wirelessly, MCU 630 may control operating modes of LEDs D1-Dn via control of another MOSFET M2. For example, temperature-based compensation, color balancing, dimming and so forth may be controlled. Note that different wireless communication protocols may be used to communicate with MCU/RF circuit 630, such as Zigbee™ or Bluetooth™ low energy protocols, for example. Understand while shown at this high level in the embodiment of FIG. 6, many variations and alternatives are possible.

Smart bulbs such as bulb 600 may connect to multi-node mesh networks deployed in smart homes and offices. In turn, a user can control smart bulbs individually or as groups, via an application or smart home ecosystem, customize an array of smart lighting features, and schedule lighting events and so forth. MCU/RF circuit 630 may further enable features such as customizable scheduling, color temperature tuning and energy tracking. Such features may, via MCU/RF circuit 630, be controlled through a cloud-connected wireless control system.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a transmit circuit to upconvert a baseband signal to a first differential radio frequency (RF) signal, the transmit circuit to convert the first differential RF signal to a first single-ended RF signal;
   a duty cycle correction circuit coupled to the transmit circuit to receive the first single-ended RF signal and compensate for a duty cycle variation in the first single-ended RF signal to output a duty cycle-corrected RF signal;
   a conversion circuit to convert the duty cycle-corrected RF signal to a second differential RF signal; and
   an interface circuit to transfer the second differential RF signal from a first ground domain to a second ground domain.

2. The apparatus of claim 1, wherein the interface circuit is further to convert the second differential RF signal to a second single-ended RF signal.

3. The apparatus of claim 2, wherein the interface circuit comprises:
   a first path having at least one inverter to receive a positive portion of the second differential RF signal and output the second single-ended RF signal;
   a second path having at least one inverter to receive a negative portion of the second differential RF signal; and
   a latch circuit coupled between the first path and the second path, the latch circuit to equalize an output formed of one or more of the positive portion and the negative portion of the second differential RF signal.

4. The apparatus of claim 3, wherein the latch circuit is to output the second single-ended RF signal from the first path and disregard the negative portion of the second differential RF signal from the second path.

5. The apparatus of claim 2, further comprising a repeater circuit to output the second single-ended RF signal to a power amplifier, wherein the power amplifier comprises a differential power amplifier.

6. The apparatus of claim 5, further comprising:
   a first voltage regulator to provide a first supply voltage to the transmit circuit; and
   a second voltage regulator to provide a second supply voltage to the power amplifier.

7. The apparatus of claim 6, further comprising a switch circuit to decouple the first voltage regulator from the transmit circuit during a first mode in which at least one of the transmit circuit and the power amplifier is not active.

8. The apparatus of claim 6, wherein the first voltage regulator is to provide the first supply voltage to the transmit circuit, the duty cycle correction circuit and the conversion circuit, and the second voltage regulator to provide the second supply voltage to at least a portion of the interface circuit and the power amplifier.

9. The apparatus of claim 8, further comprising:
   the first ground domain including the transmit circuit, the duty cycle correction circuit and the conversion circuit; and
   the second ground domain including at least a portion of the interface circuit and the power amplifier, the first ground domain to be provided with a first independent ground voltage, the second ground domain to be provided with a second independent ground voltage.

10. The apparatus of claim 1, wherein the duty cycle correction circuit comprises:
    a first path having a first set of inverters and a first output transistor having a gate terminal coupled to an output of a first inverter of the first path and an output terminal coupled to an output node, wherein a pulldown impedance of the first inverter of the first set of inverters is controlled by a first trim signal; and
    a second path having a second set of inverters and a second output transistor having a gate terminal coupled to an output of a first inverter of the second path and an output terminal coupled to the output node, wherein a pullup impedance of a first inverter of the second set of inverters is controlled by a second trim signal and the duty cycle correction circuit is to provide the duty cycle-corrected RF signal at the output node.

11. The apparatus of claim 10, further comprising a controller to receive at least one feedback voltage from a power amplifier and to generate the first trim signal and the second trim signal based at least in part thereon.

12. The apparatus of claim 10, wherein the conversion circuit comprises:
    an inverter coupled to receive a positive portion of the duty cycle-corrected RF signal at the output node; and
    a buffer to receive a negative portion of the duty cycle-corrected RF signal at the output node.

13. The apparatus of claim 1, wherein the apparatus comprises an integrated circuit having a first semiconductor die including the transmit circuit, the duty cycle correction circuit, the conversion circuit, the interface circuit and a power amplifier.

14. The apparatus of claim 13, wherein the apparatus comprises a smart bulb including one or more light emitting diodes and a controller to control the one or more light emitting diodes, wherein the power amplifier is to send a communication to an automation system.

15. An integrated circuit comprising:
    a driving circuit to output a single-ended clock signal;
    a first conduit to communicate the single-ended clock signal;
    a duty cycle correction circuit coupled to the first conduit to receive the single-ended clock signal and compensate for a duty cycle variation in the single-ended clock signal caused by harmonic energy;
    a conversion circuit to convert the compensated single-ended clock signal to a differential signal;

an interface circuit to transfer the differential signal from a first ground domain to a second ground domain and convert the differential signal to a second single-ended signal; and a second conduit to communicate the second single-ended signal to a receiving circuit.

16. The integrated circuit of claim 15, wherein the duty cycle correction circuit is controllable in response to feedback information from the receiving circuit, wherein the duty cycle variation is caused by a ground bounce in the second ground domain.

17. The integrated circuit of claim 15, wherein the interface circuit comprises:
a first path having at least one inverter to receive a positive portion of the differential signal and output the second single-ended signal, the at least one inverter of the first path to receive a ground voltage of the second ground domain;
a second path having at least one inverter to receive a negative portion of the differential signal, the at least one inverter of the second path to receive the ground voltage of the second ground domain; and
a latch circuit coupled between the first path and the second path, the latch circuit to reduce variation in at least the positive portion of the differential signal, the variation due to the harmonic energy.

18. A method comprising:
receiving, in a duty cycle correction circuit of a transmitter, a first single-ended radio frequency (RF) signal;
compensating, in the duty cycle correction circuit, for a duty cycle variation in the first single-ended RF signal;
outputting a duty cycle-corrected RF signal from the duty cycle correction circuit to a conversion circuit, and converting the duty cycle-corrected RF signal to a differential RF signal;
transferring the differential RF signal from a first ground domain of the transmitter to a second ground domain of the transmitter; and
converting the differential RF signal to a second single-ended RF signal, and sending the second single-ended RF signal to a differential power amplifier.

19. The method of claim 18, further comprising removing variation in the differential RF signal due to variation between the first ground domain and the second ground domain before converting the differential RF signal to the second single-ended RF signal, the first ground domain isolated from the second ground domain.

20. The method of claim 18, wherein compensating for the duty cycle variation comprises adjusting the first single-ended RF signal based at least in part on feedback information from the differential power amplifier.

* * * * *